United States Patent [19]

Donley et al.

[11] 4,426,638

[45] Jan. 17, 1984

[54] FLASHER FOR VEHICLE LIGHTS

[76] Inventors: Robert Donley, 2291 Picket Post La., Columbus, Ohio 43220; Terry Dawson, 1367 Crestview St., Reynoldsburg, Ohio 43068

[21] Appl. No.: 315,174

[22] Filed: Oct. 26, 1981

Related U.S. Application Data

[63] Continuation-in-part of Ser. No. 262,200, May 8, 1981, Pat. No. 4,368,349.

[51] Int. Cl.³ .............................................. B60Q 1/26
[52] U.S. Cl. .................................... 340/74; 340/81 F; 315/83
[58] Field of Search ...................... 340/74, 81 R, 81 F, 340/80, 83, 331, 72; 315/83

[56] References Cited

U.S. PATENT DOCUMENTS

| | | | |
|---|---|---|---|
| 3,873,969 | 3/1975 | Baader et al. | 340/72 |
| 4,117,454 | 9/1978 | Fabry et al. | 340/81 F |
| 4,268,713 | 5/1981 | Donley et al. | 340/81 R |

Primary Examiner—Donald J. Yusko

[57] ABSTRACT

A flasher controller for vehicle warning lights that comprises a housing for a circuit board that electrically controls the device. The apparatus includes a mounting strap of conductive material which includes an internal ground connection with the circuit board and a mounting flange external of the housing that functions as the external ground connection for the circuit board. The housing is filled with a resinous material that functions as a weatherproof seal, as well as means for securing the mounting strap to the housing. The device is adapted to automatically sequentially operate and flash either amber or red warning lights on the vehicle in accordance with a plurality of selectable programs. The control functions are effected entirely by solid state electrical components which are potted together with the mounting strap.

8 Claims, 6 Drawing Figures

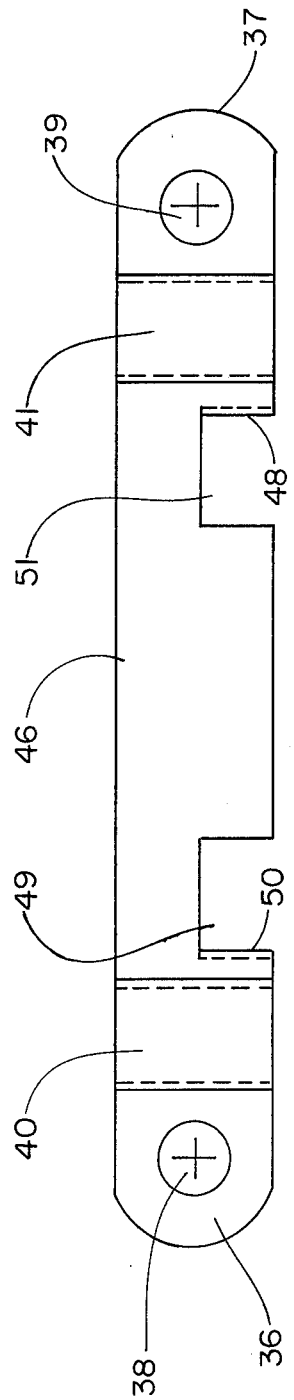
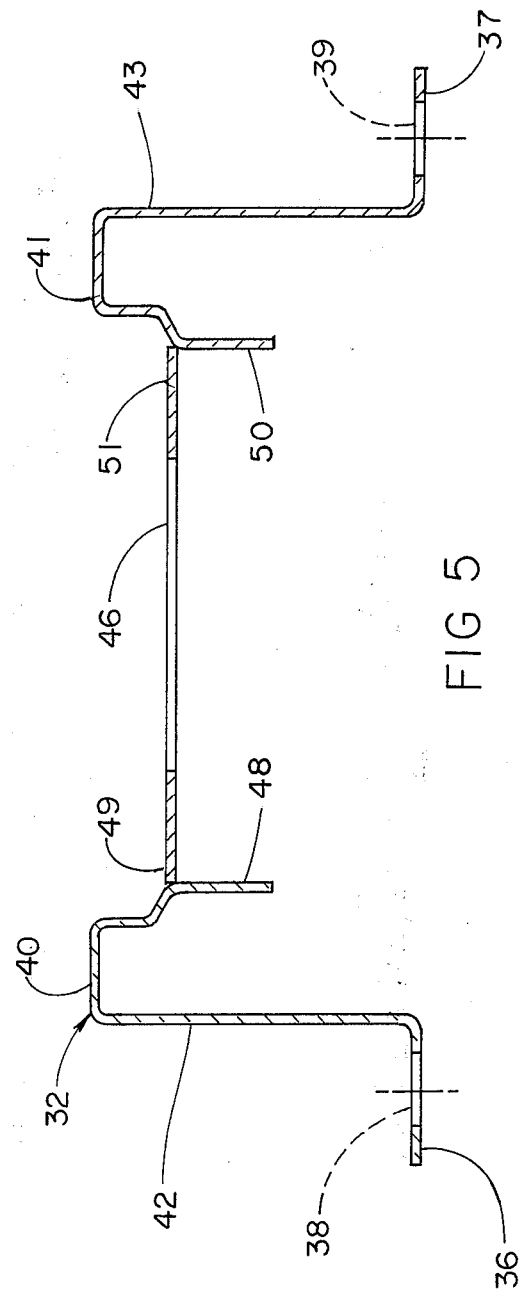

FLASHER FOR VEHICLE LIGHTS

This application is a continuation in part of our co-pending application Ser. No. 262,200 filed May 8, 1981, now U.S. Pat. No. 4,368,349.

BACKGROUND OF THE INVENTION

This application generally relates to flasher controllers for vehicle lights and more particularly to improved method and apparatus for assembly and operation of such apparatus.

PROBLEMS IN THE ART

In the use of high intensity flasher controllers, such as are used on school busses, farm machinery and the like, a problem has been present, in that water damage is the common cause of failure of the electrical and mechanical components. These devises are commonly subjected to moisture from the environment. In the case of school busses, the flasher controllers are required by law to automatically and sequentially flash either amber or red lights and have in the past consisted of relatively complex devices which included both electrical and mechanical components for effecting the required control functions. Since these controllers are commonly mounted under the dashboards, and the interiors of the busses are frequently washed with a hose, the flasher controllers become subjected to repeated wettings with resulting damage to any exposed electrical and mechanical components.

SUMMARY OF THE INVENTION

In general the present invention comprises a novel flasher controller for bus lighting systems and a method of making same, wherein a main housing is used to form a cavity for enclosing the circuit board. A mounting strap for securing the device to the vehicle frame is formed of electrically conductive metal and provided with an internal ground connection that plugs into a ground connection on the circuit board; as well as an external mounting flange that serves the additional function as the external ground connection for the control circuit. A potting material, such as an epoxy resin, is poured into the cavity in surrounding relationship with the circuit board and internal portion of the ground strap, so as to provide a positive weatherproof seal for the electrical components, as well as means for securing the mounting strap to the housing.

It is another aspect of the present invention to provide a flasher controller of the type described wherein the control circuit board is provided with up-standing connectors which extend to the exterior of the main housing to form plug connectors, and which are imbedded in the resinous material, so as to be sealed and reinforced thereby.

It is another aspect of the present invention to provide a flasher controller for bus warning signals adapted for automatically sequentially operating and flashing either amber or red lights responsive to door switch actuation. The programming and control of the red and amber lights is effected by a novel solid state electrical controller that eliminates mechanical components which have here to fore been the major cause of failure of such controllers.

It is another aspect of the present invention to provide a flasher controller of the type described that is adapted for selective use as a stop arm controller.

It is another aspect of the present invention to provide a flasher controller of the type described that is adapted for the selective externally effected by-pass of certain control functions of the internal light control sequence. This facilitates compliance with variations in state laws relating to light diplays at railroad crossings.

It is therefore a primary object of the present invention to provide a novel flasher controller and method of fabricating same, wherein the components are assembled in a unique manner, so as to provide positive moisture protection for the electrical components.

It is another object of the present invention to provide a novel flasher controller for school bus warning lights wherein the programming and operation of the device is effected by solid state electrical components thereby eliminating mechanical components which have been a major cause of failure of such devices.

It is another object of the present invention to provide an apparatus of the type described wherein the components are secured together with high structural integrity.

Further objects and advantages of the present invention will be apparent from the following description, reference being had to the accompanying drawings wherein preferred forms of the embodiments of the invention are clearly shown.

BRIEF DESCRIPTIONS OF THE DRAWINGS

FIG. 4 is a top elevational view of a mounting strap comprising a portion of the apparatus of the preceding figures;

FIG. 5 is a side elevational view corresponding to FIG. 4; and

Figure 1:
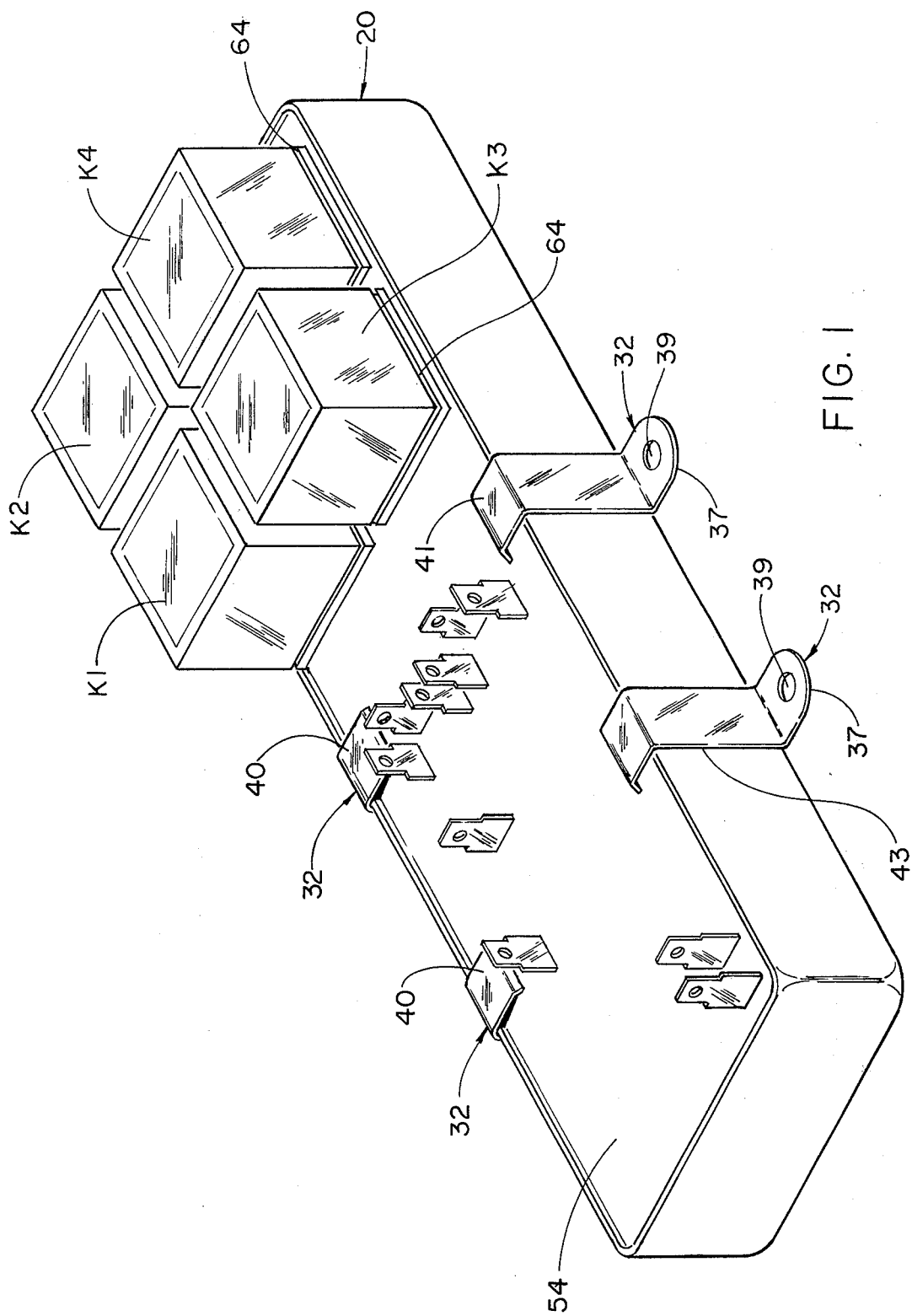
FIG. 1 is a perspective view of a flasher controller constructed in accordance with the present invention.
Figure 2:
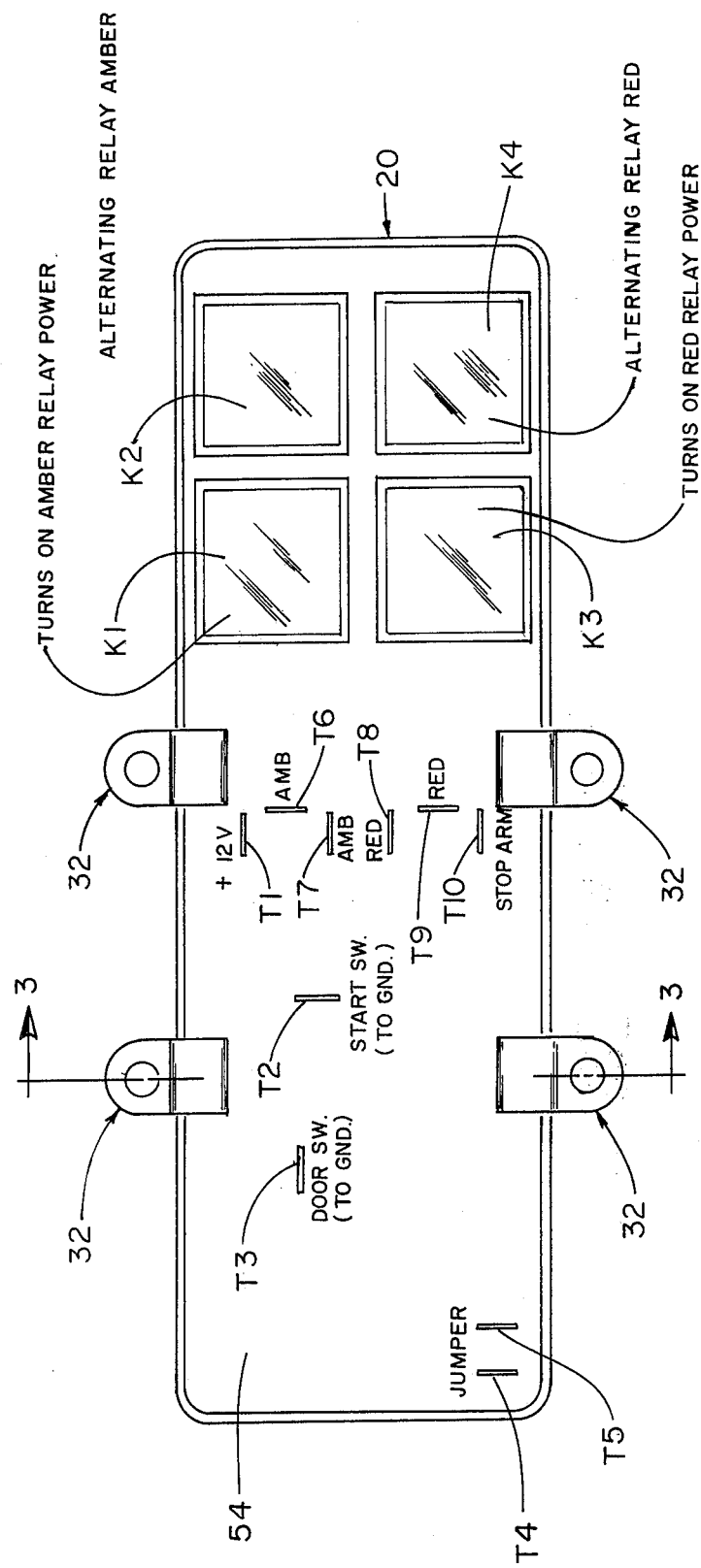
FIG. 2 is a top elevational view of the flasher controller of FIG. 1.
Figure 3:
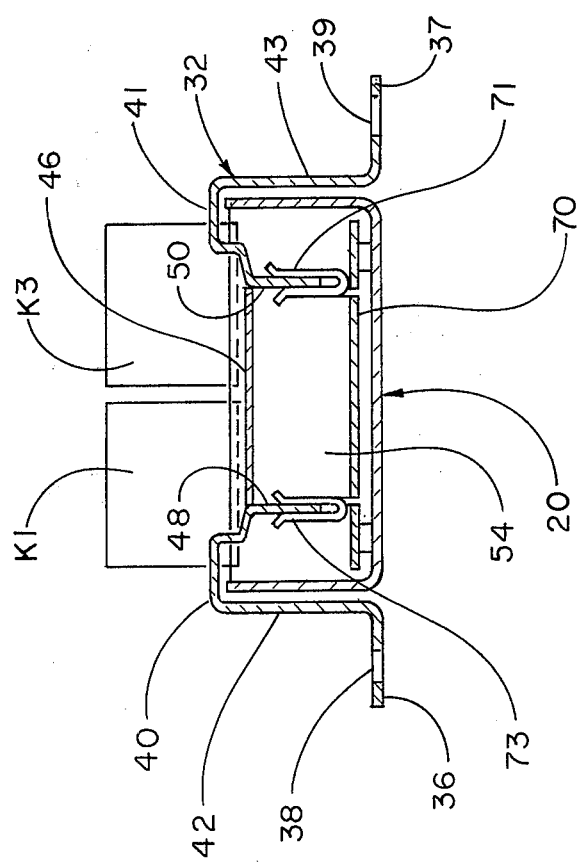
FIG. 3 is an end sectional view of the apparatus of the proceeding figures, with the section being taken along a vertical plane through the center of the apparatus.

Referring in detail to the drawings, the flasher controller of the present invention comprises a main housing indicated generally at 20 in FIGS. 1–3 which forms a cavity for receiving a circuit board indicated at 70 in FIG. 3.

The housing 20 is secured to the vehicle frame by two mounting and grounding means or straps indicated generally at 32 and shown in assembled relationship with housing 20 in FIGS. 1–3. As seen in FIGS. 3–5, each strap 32 includes flanges or shoulders 48 and 50 which form inner strap ground terminals, with such flanges being bent from a central strap portion 46. One end of strap 32 includes external flanges 41, 43 and 37, with flange 37 including a mounting hole 39 for receiving a mounting screw not illustrated. The other end of mounting strap 32 includes external flange portion 40, 42 and 36 with flange 36 including a second mounting hole 38. It will now be understood that the exterior mounting flanges 36 and 37 form the external ground connections for circuit board 70, since mounting strap 32 is made from electrically conductive sheet metal material and since the internal flanges 48 and 50 are plugged into circuit board ground terminal 71 and 73 which extend upwardly from circuit board 70, as seen in FIG. 3.

After the ground straps 32 are positioned on the housing 20, as seen in FIGS. 1–3 the cavity of the housing is poured full of a suitable insulation compound 54 such as epoxy resin, such that the compound surrounds the circuit board and internal portions of mounting strap 32, including the internal ground connections 50 and 71, and 48 and 73, thereby securing the ground strap securely to housing 20.

Figure 6:
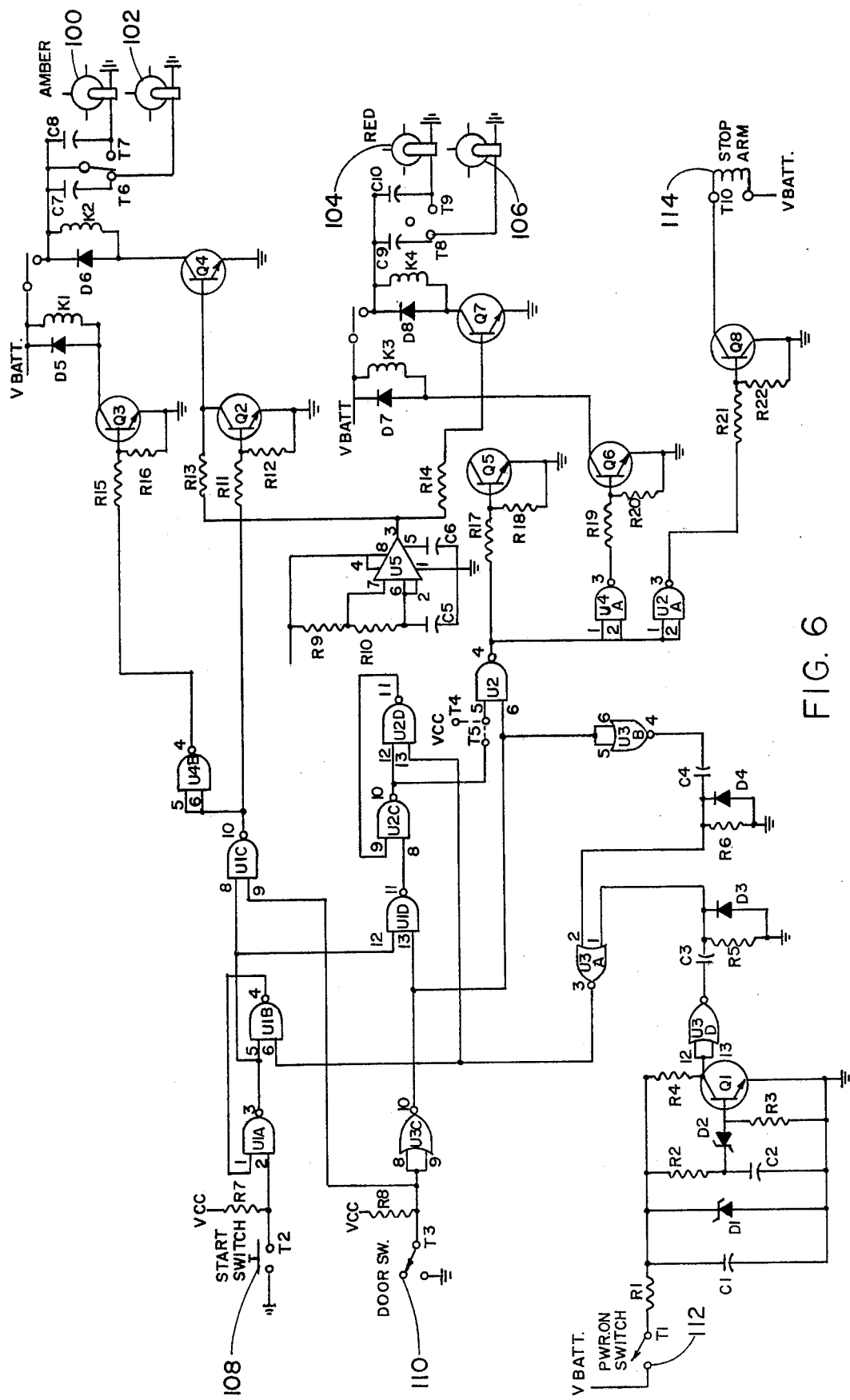
FIG. 6 is a schematic view showing the circuit for the flasher controller of the present invention.

Referring to FIGS. 2 and 6, the apparatus includes four plug-in type relays K1, K2, K3 and K4. Each relay is removeably mounted in respective female receptical 64, which is connected to the circuit on circuit board 70, with each receptical being potted in compound 54.

Relay K1 and K2 control two amber lights on the vehicle relay K1 being an on-off switch for energizing its companion relay K2 which is an alternating relay that alternatingly flashes the two amber lights 100 and 102.

In the same manner relays K3 and K4 control two red lights on the vehicle with relay K3 being an on-off switch for energizing its companion relay K4, the latter being an alternating relay that alternatingly flashes the two red lights 104 and 106.

Referring particularly to FIGS. 2 and 6, the apparatus includes ten plug in terminals formed by ten upstanding conductors T1–T10 each of which includes a lower end connected to the circuit on circuit board 70 and an upper end extending above compound 54, so as to form a plug in connection with an external circuit component.

As seen in FIG. 6, conductor T1 is connected to a power on switch 112 which activates a power on reset circuit as will later be described.

Conductor T2 is connected to a remote start switch 108 which is mounted on the vehicle dash board and is turned on and off by the driver of the vehicle.

Conductor 72 leads to a remote door switch 110 which is actuated by opening and closing of the vehicle door.

The two amber conductors T6 and T7 are respectively connected to the two previously mentioned amber lights and red conductors T8 and T9 are respectively connected to the two red lights mentioned above.

Another conductor T10 is provided for the selective connection of a stop arm operator 114 for extending and retracting a conventional stop arm such as are mounted on the sides of school busses in locations where such are required by state law.

Two jumper conductors T4 and T5 are provided, so as to make a single standardized flasher controller selectively adaptable to two different automatic control sequences. This is advantageous since some state laws prohibit a bus from flashing red lights, when stopped at a railroad crossing, whereas, other states require the use of flashing red lights under the same circumstances. Hence, the circuit of the present apparatus is programmed such that when jumper conductors T4 and T5 are open the red lights will not go on when the driver re-opens the vehicle door, when stopped at a railroad crossing.

When the jumper conductors T4 and T5 are connected by a jumper, however, the red lights will go on every time the vehicle door is opened, including when stopped at a railroad crossing.

Sequence A—Jumper Conductors open:

1. Driver actuates start switch—amber light goes on.
2. Opens door—amber lights go off, red lights go on.
3. Closes door—red lights go off.
4. Opens door—no lights go on.
5. Actuates start switch with door open—red lights go on.
6. Closes door—red lights go off.

Sequence B—Jumper Conductors closed:

1. Same as sequence A.
2. Same as sequence A.
3. Same as sequence A.
4. Opens door—red lights go on.
5. Closes door—red lights go off.

It should be mentioned that in both sequences stop arm actuator 114, where required, is connected at conductor T10 and the controller then functions to extend the stop arm each time the red lights go on and retract the stop arm each time the red lights go off.

It should also be mentioned that the conductors T2 thru T10, excepting conductor T1, are all positive terminals leading to an external circuit accessory which is in turn grounded to the vehicle frame.

Reference is next made to FIG. 6 which is a diagram of a circuit for effecting the control functions of the present invention.

POWER ON RESET

Power from the battery is applied to the circuit via a power on switch 112. Shunt regulation is used in parallel with a filter capacitor C1. The Zener diodes D1 and D2 are intended to limit transient spikes as well as provide a degree of shunt regulation. The circuit power Vcc is applied to the collector load resistor of Q1 and to delay resistor R2. Transistor Q1 will initially be off since there is no base current source.

The delay capacitor C2 starts charging towards the control circuit voltage Vcc via resistor R2. At the same time, set by the R2—C2 product, the voltage at the junction of the resistor and capacitor will reach Vzt+Vbe, the sum of the zener diode voltage and the base emitter diode turn on voltage of a reset transistor Q1. At that time the zener diode will avalanche and Q1 will start conducting. This will produce a high to low transition at the collector of Q1 which will be inverted and sharpened by U3D. This positive transition will then be differentiated and the positive spike inverted by U3A. The negative spike output is then sent to the reset inputs of both a red flip-flop U2D and an amber flip-flop UIA and VIB resetting them to the normal state. This circuit will insure that the system will be in a normal, no lights on, state within milliseconds after the application of power.

BASIC FUNCTION

The actuation of a start switch 108 by the driver acts as an input to amber flip-flop UIA and U1B. Because all gates are in the normal state due to the power on reset circuit described above, start switch 108 will apply momentarily input to U1A which will cause the output of U1A to go high and the output of U1B to go low. The output of U1A is one of the inputs to U1C. The other input to U1C is from a door switch 110 which will be high if the door is closed. These two high inputs will cause the output of U1C to go low which will turn off clamp transistor Q2 and allow the output of the oscillator/relay driver circuit to toggle relay driver transistor Q4, which drives an amber light alternating relay K2.

When the door is opened by the driver, door switch 110 is closed. This provides a low to one of the inputs of U1C which causes its output to go high turning on clamp resistor Q2 which clamps the base of transistor Q3 to 0,2 v turning off Q3 and deactivating the amber light power switch relay K1. The door switch also applies a high to one of the inputs of U2B and also a low to nand gate U1D. The other input to U1D is from the amber channel flip-flop U1A and U1B. This input to U1D (from the amber flip-flop) will be low if a start switch 108 has not previously been activated, and the input signal from the door switch 110 will not be promolgated beyond the nand gate U1D. The second input to U1D will however be high if start switch 108 was depressed. These two high inputs to U1D will cause its output to go low and this low will be an input to the red flip-flop consisting of U2C and U2D. This will cause the output of U2C to latch high and the output of U2D to latch low. The output of U2C, which is now high, is one of the inputs to U2B. The other input is the inverted door switch input which will also be high if door switch 110 is actuated. These two highs will cause the output of U2B to go low which will turn off transistor Q5 allowing the output of the oscillator/relay driver circuit to toggle relay driver transistor Q7 which drives a red light alternating relay K4.

When the door is closed the door switch 110 applies a high input which is double inverted by U3B, which provides a positive transition that is differentiated on the output of U3B. The positive spike is inverted by U3A and fed to the reset inputs of both the amber and red flip-flops consisting of U1A and U1B and U2C and U2D. This resets them to their original configuration prior to the beginning of the sequence.

When the door is opened before start switch 108 is depressed, a high via U3C is applied to the input of U2B and U1D. Since the other input to U1D is from amber flip-flop U1A and U1B it will be low if the start switch has not been depressed and the door open signal will not get past the nand gate U1D to toggle the red flip-flop U2C and U2D. Since the red flip-flop has not been toggled, its output from U2C, which is the other input to U2B will be low. Since one of the two inputs on U2B is low, the high applied from the inverted door switch signal will have no effect on U2B and no lights will come on. If the door is closed, at this time an inverted high will be fed to the reset circuit which will apply a reset pulse to both flip-flops (which will have no effect since they were not set) and the circuit will return to its normal state, ready for the sequence to begin.

If the start switch is activated while the door is open, it will set the amber flip-flop U1A and U1B which will apply a high to one input of U1C. This will have no effect because the gate is held off by the other input which has a low from door switch 110. Therefore the amber lights 100 and 102 are not activated. The set amber flip-flop U1A and U1B also provides a high to one input of the nand gate U1D which coupled with the high on the other input from the inverted door open signal causes the output of U1D to go low setting red flip-flop U2C and U2D. The output from U2C of the red flip-flop goes high. This is applied to one of the inputs of U2B along with a high from the inverted door switch 110. These two highs cause the output of U2B to go low turning on the red flashing circuits and the stop arm circuit. When the door is closed the normal rest sequence, via U3A, U3B, and U3C, return the circuit to its normal state, ready for the sequence to begin again.

An optional jumper across terminals T4 and T5 can be used to replace the input of U2B from red flip-flop U2C and U2D with an input from Vcc. This makes the state of the output of U2B dependant only on the condition of door switch 110, and the red flashing circuits will be on anytime the door switch is actuated.

OSCILLATOR/RELAY DRIVER CIRCUIT

Since the oscillator circuit is probably the most temperature sensitive from a specification point of view, and differences in frequency would be more noticeable than the absolute value of the frequency (even if it should be off slightly), the approach was taken to use a single oscillator U5 running constantly and gate that signal to either one or none of the relay driver transistors Q4 and Q7. The gating is accomplished by using two clamp transistors Q2 and Q5. In the normal system off state both of these transistors are saturated holding the base voltages of relay driver transistors Q4 and Q7 below conduction potential. The oscillator U5 is running but the signal is being dissipated in the two resistors R13 and R14 in series with the bases of the relay driver transistors Q4 and Q7. When an output is required, the appropriate clamp transistors Q2 or Q5 is turned off and the oscillator signal is supplied to the base of the associated relay driver transistor Q4 or Q7 causing it to toggle its respective alternating relay K2 or K4 and thereby flash the selected lights.

We claim:

1. A controller for operating vehicle signal lights of the type that include a set of amber warning lights and a set of red stop lights, said controller comprising, in combination, an amber alternating relay in circuit with the amber lights for flashing same; a red alternating relay in circuit with the red lights for flashing same; an amber light control circuit for energizing and deenergizing said amber alternating relay and for delivering timed pulses to said alternating relay; a start switch for energizing said amber light control circuit; a red light control circuit for energizing and deenergizing said red alternating relay and for delivering timed pulses to said amber alternating relay, said red light control circuit being connected to said amber light control circuit for deenergizing said amber alternating relay; and a door switch for energizing and deenergizing said red light control circuit.

2. A controller for operating vehicle signal lights of the type that include a set of amber warning lights and a set of red stop lights, said controller comprising, in combination, an amber alternating relay in circuit with the amber lights for flashing same; a red alternating relay in circuit with the red lights for flashing same; an amber light control circuit including an amber flip-flop circuit portion for energizing and deenergizing said amber alternating relay and for delivering timed pulses to said amber alternating relay; a start switch for energizing said amber light control circuit; a red light control circuit including a red flip-flop circuit portion for energizing and deenergizing said red alternating relay and for delivering timed pulses to said red alternating relay, said red light control circuit being connected to said amber light control circuit for deenergizing said amber alternating relay, each of said flip-flop circuit portions including a normal set state wherein its respective alternating relay is energized and an inverted state wherein its respective alternating relay is deenergized; a door switch for energizing and deenergizing said red light control circuit; a power on reset circuit including a power on switch for resetting said amber and red flip-flop circuit portions to said normal set states.

3. The controller defined in claim 2 wherein said door switch is connected to the reset inputs of both the amber and red flip-flop circuit portions whereby said flip-flop circuit portions are reset to their normal set states when the door switch is activated by closing of the vehicle door.

4. The controller defined in claim 2 that includes two jumper terminals in said red light control circuit which terminals, when connected, replace the output from the red flip-flop circuit portion with a constant output from the control circuit voltage whereby the red alternating relay will be energized any time the door switch is actuated.

5. The controller defined in claim 2 wherein said door switch is connected to the reset inputs of both the amber and red flip-flops whereby said flip-flop are reset to their normal states when the door switch is activated by closing of the vehicle door.

6. The controller defined in claim 7 that includes two jumper terminals in said red light control circuit which terminals, when connected, replace the output from the red flip-flop with a constant output from the control circuit voltage whereby the red alternating relay will be energized any time the door switch is actuated.

7. A controller for operating vehicle signal lights of the type that include a set of amber warning lights and a set of red stop lights, said controller comprising, in combination, an amber alternating relay in circuit with the amber lights for flashing same; a red alternating relay in circuit with the red lights for flashing same; an oscillator/relay driver in circuit with said amber and red alternating relays for delivering pulses to said relays; an amber light control circuit for energizing and deenergizing said amber alternating relay and for connecting said oscillator/relay driver with said amber alternating relay; a start switch for energizing said amber light control circuit; a red light control circuit for energizing and deenergizing said red alternating relay and for connecting said oscillator/relay driver with said alternating relay, said red light control circuit being connected to said amber light control circuit for deenergizing said amber alternating relay; and a door switch for energizing and deenergizing said red light control circuit.

8. A controller for operating vehicle signal lights of the type that include a set of amber warning lights and a set of red stop lights, said controller comprising, in combination, an amber alternating relay in circuit with the amber lights for flashing same; an oscillator/relay driver in circuit with said amber and red alternating relays for delivering pulses to said relays; an amber lights control circuit for energizing and deenergizing said amber alternating relay and for connecting said oscillator/relay driver with said amber alternating relay; a start switch for energizing said amber light control circuit; a red light control circuit for energizing and deenergizing said red alternating relay and for connecting said oscillator/relay driver with said red alternating relay, said red light control circuit being connected to said amber light control circuit for deenergizing said amber alternating relay; a door switch for energizing and deenergizing said red light control circuit, an amber flip-flop in said amber light control circuit, said amber flip-flop including a normal set state wherein said amber alternating relay in deenergized and an inverted state wherein said amber alternating relay is energized, a red flip-flop in said red light control circuit, said red flip-flop including a normal set state wherein said red alternating relay is deenergized and an inverted state wherein said red alternating relay is energized; a power on reset circuit in circuit with said amber flip-flop and said red flip-flop for resetting said flip-flops to said normal set states; and a power on switch for energizing said power on reset circuit.

* * * * *